United States Patent
Thiery

(10) Patent No.: US 8,488,289 B2
(45) Date of Patent: Jul. 16, 2013

(54) CURRENT PROTECTION CIRCUIT FOR INTELLIGENT POWER SWITCH

(75) Inventor: Vincent Thiery, La Roque D'Antheron (FR)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/780,858

(22) Filed: Jul. 20, 2007

(65) Prior Publication Data

US 2008/0074820 A1    Mar. 27, 2008

Related U.S. Application Data

(60) Provisional application No. 60/827,131, filed on Sep. 27, 2006.

(51) Int. Cl.
  *H02H 9/02*    (2006.01)
(52) U.S. Cl.
  USPC .................................... 361/93.9; 361/93.7
(58) Field of Classification Search
  USPC ............................ 361/93.7–93.9
  See application file for complete search history.

(56) References Cited

U.S. PATENT DOCUMENTS

| | | | | |
|---|---|---|---|---|
| 4,809,122 | A * | 2/1989 | Fitzner | 361/18 |
| 5,325,258 | A * | 6/1994 | Choi et al. | 361/87 |
| 5,894,394 | A * | 4/1999 | Baba et al. | 361/87 |
| 6,288,883 | B1 * | 9/2001 | Chen | 361/58 |
| 6,594,129 | B1 * | 7/2003 | Baba et al. | 361/87 |
| 7,079,368 | B2 * | 7/2006 | Ishikawa et al. | 361/93.1 |
| 7,218,496 | B2 * | 5/2007 | Kitagawa | 361/93.9 |
| 7,499,253 | B2 * | 3/2009 | Hirata et al. | 361/103 |
| 2002/0118500 | A1 * | 8/2002 | Covi et al. | 361/93.1 |
| 2003/0072120 | A1 * | 4/2003 | Ishikawa et al. | 361/93.9 |
| 2006/0050449 | A1 * | 3/2006 | Wu | 361/18 |

* cited by examiner

*Primary Examiner* — Danny Nguyen
(74) *Attorney, Agent, or Firm* — Farjami & Farjami LLP

(57) ABSTRACT

An intelligent power switch (IPS) circuit providing current protection for a power switch, a gate terminal of the power switch being controlled by a first control signal generated by a gate driver. The IPS circuit includes a first circuit to measure a current in the power switch, determine a first difference between a first voltage and a first reference voltage, and reduce the first control signal if the first difference exceeds a first predetermined limit; and a second circuit to measure the current in the power switch and determine a second difference between the first voltage and a second reference voltage, wherein if the second difference exceeds a second predetermined limit the first control signal is set to turn OFF the power switch.

20 Claims, 3 Drawing Sheets

CURRENT PROTECTION CIRCUIT FOR INTELLIGENT POWER SWITCH

CROSS-REFERENCE TO RELATED APPLICATION

This application is based on and claims priority to U.S. Provisional Patent Application Ser. No. 60/827,131, filed on Sep. 27, 2006 and entitled CURRENT PROTECTION CIRCUIT FOR INTELLIGENT POWER SWITCH, the entire contents of which are hereby incorporated by reference.

BACKGROUND OF THE INVENTION

The present invention relates to switching circuits, and in particular to current protection circuits for power switches, for example, intelligent power switches which typically have a MOSFET as an output switching transistor for driving a power load, for example, a motor.

An intelligent power switch (IPS) is an integrated circuit having a semiconductor power switching device which includes circuits for protecting the power switch, for example turning the power switching device off in the case of overcurrent, overtemperature, or other overloads. FIG. 1 shows a part of a known intelligent MOSFET power switch.

The illustrated power switch includes a main power switch 10 and an additional transistor circuit 20 that may be provided integrally with the power switch 10 or as a separate component. The transistor circuit 20 passes a small fraction of the current provided by the power switch and serves as a current sense. Typically a resistor R1 is monitored to determine the amount of current passing through the switch 10 into the load. In FIG. 1, the load is illustrated as a resistive component, but it may also be a reactive component, for example, a motor.

A comparator COMP1 monitors the voltage across the resistance, compares that voltage to a reference voltage REF1, and controls the gate voltage from the gate driver DRVR to control/reduce/terminate the gate current to the power switch 10 and the additional transistor circuit 20 if the monitored current is excessive.

The illustrated prior art circuit has certain limitations. For example, in the event of a short circuit, when the power device 10 is turned ON, the gate voltage will increase until internal regulation limits the gate voltage typically to around 3 volts.

The more problematic situation occurs when the power device 10 is ON and, as shown in a graph of FIG. 1A, a short circuit occurs. The waveform OUT shows the output of the power device 10 at that moment. The nearly vertical line dropping to zero identifies the short circuit.

When the short circuit occurs, the power device 10 is fully ON and the gate voltage is approximately 5 volts. The short circuit current $I_{SC}$ quickly reaches a saturation current level $I_{DESAT}$, which depending on the inductance, will be considerably larger than the current limit $I_{LIMIT}$. This will limit the current increase. The internal current limit block including COMP1 (FIG. 1) in the IPS will take a relatively long time to reduce a gate-source voltage $V_{GS}$ to around 3 volts, the gate voltage limit.

It is difficult for the circuit to react quickly to the current limit without going into oscillation and it is almost impossible to have a fast loop that will be stable with any type of load. For example, for a 20 milliohm IPS the current limit will be about 50 amps and the saturation current $I_{DESAT}$ with the gate-source voltage $V_{GS}$ of 5 volts will be approximately 300 amps. Such high currents can destroy the power device.

SUMMARY OF THE INVENTION

It is an object of the present invention to provide a current protection circuit that will protect the power device from being destroyed by high currents.

Provided is an intelligent power switch (IPS) circuit providing current protection for a power switch, a gate terminal of the power switch being controlled by a first control signal generated by a gate driver. The IPS circuit includes a first circuit to measure a current in the power switch, determine a first difference between a first voltage and a first reference voltage, and reduce the first control signal if the first difference exceeds a first predetermined limit; and a second circuit to measure the current in the power switch and determine a second difference between the first voltage and a second reference voltage, wherein if the second difference exceeds a second predetermined limit the first control signal is set to turn OFF the power switch.

Other features and advantages of the present invention will become apparent from the following description of the invention that refers to the accompanying drawings.

DETAILED DESCRIPTION OF EMBODIMENTS OF THE INVENTION

Figure 2A:
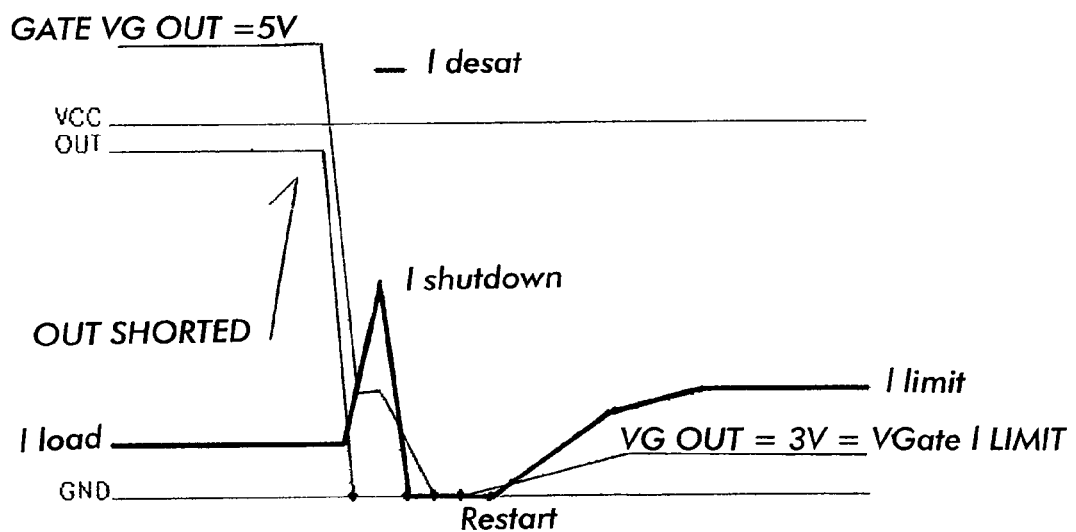
FIG. 2a is a diagram showing voltage and current acting on the power device of the circuit of FIG. 2 during a short circuit.
Figure 2:
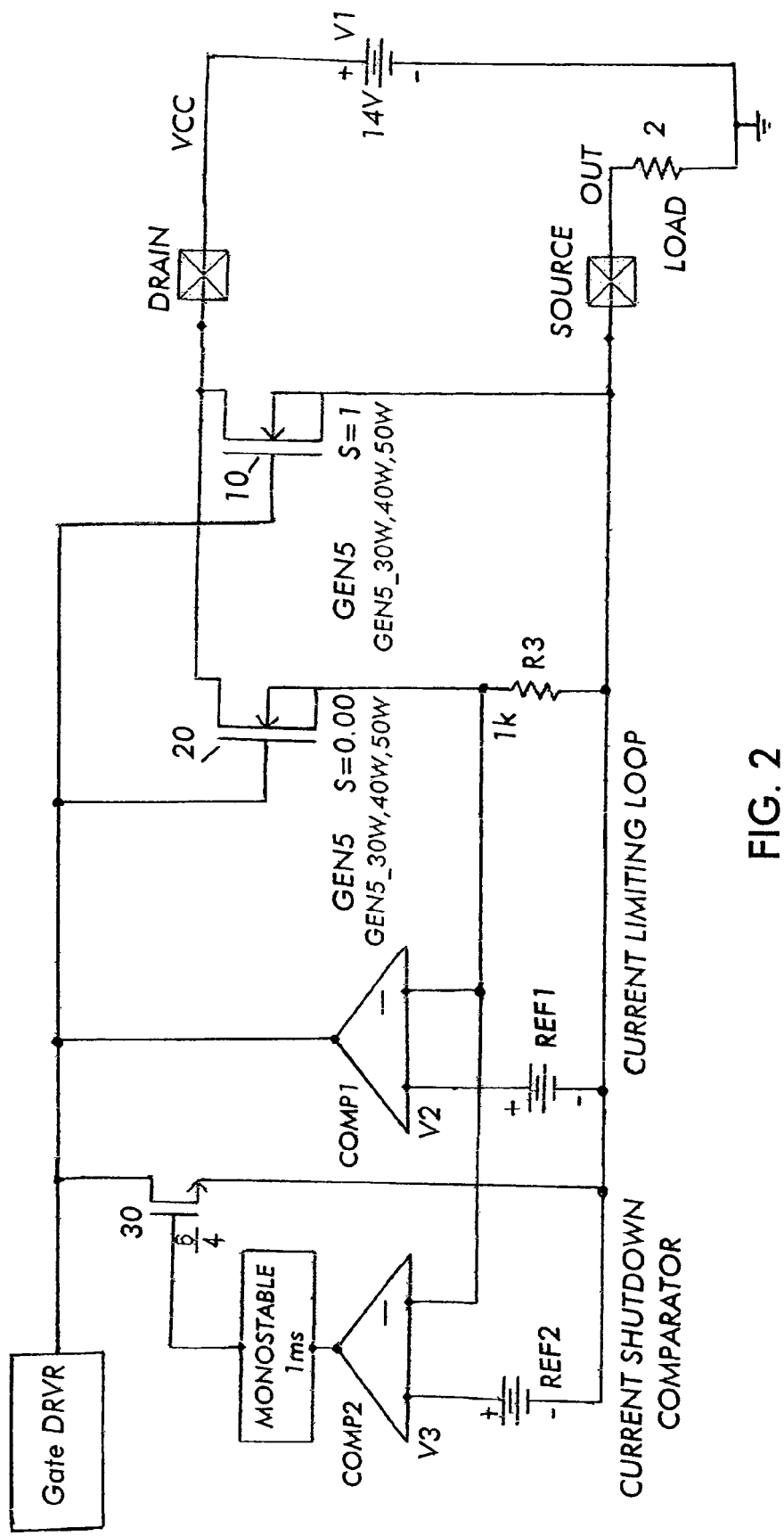
FIG. 2 is a circuit diagram of a part of an intelligent power switch of the present invention.

FIG. 2 illustrates a circuit that presents a solution to the above-stated problem. The IPS of the present invention may be used for protecting both high- and low-side switches, e.g., MOSFET, of a switching stage connected at a switching node for driving a power load in cases of overcurrent, overtemperature, or other overloads.

An additional short circuit block, comprising a second comparator COMP2 that monitors the voltage across the resistance R3, compares that voltage to a second reference voltage REF2 and depending on the result resets a latch LATCH that enables a second additional transistor circuit 30 after a predetermined delay, is provided. The latch can be a monostable or a one-shot device.

As shown in FIG. 2A, the short circuit block provides a second reference current limit $I_{REF2}$ or $I_{shutdown}$, that is above the current limit $I_{LIMIT}$ provided by the comparator COMP1. For example, the second reference current limit $I_{REF2}$ or $I_{shutdown}$ may be 70 amps whereas the current limit $I_{REF1}$ or $I_{LIMIT}$ equals 50 amps.

Figure 1:
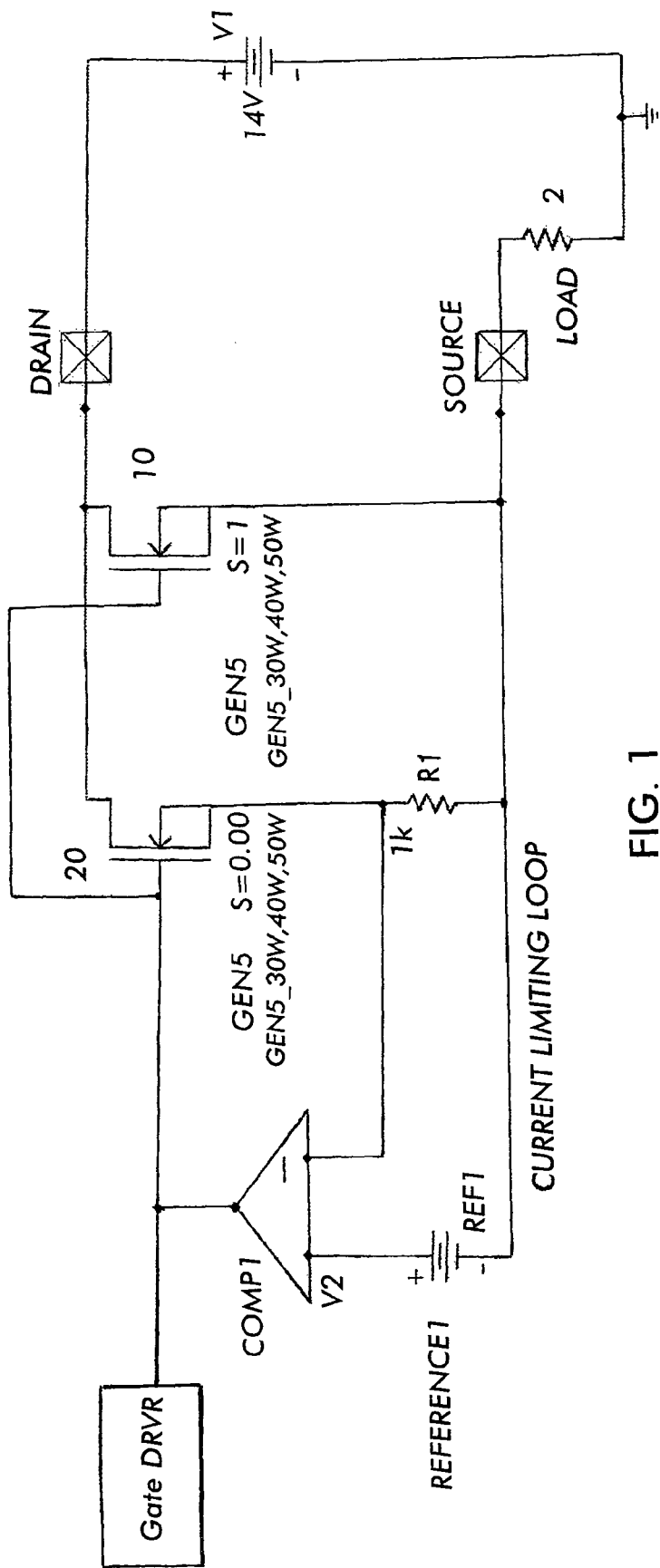
FIG. 1 is a circuit diagram of a part of an intelligent power switch of the prior art.
Figure 1A:
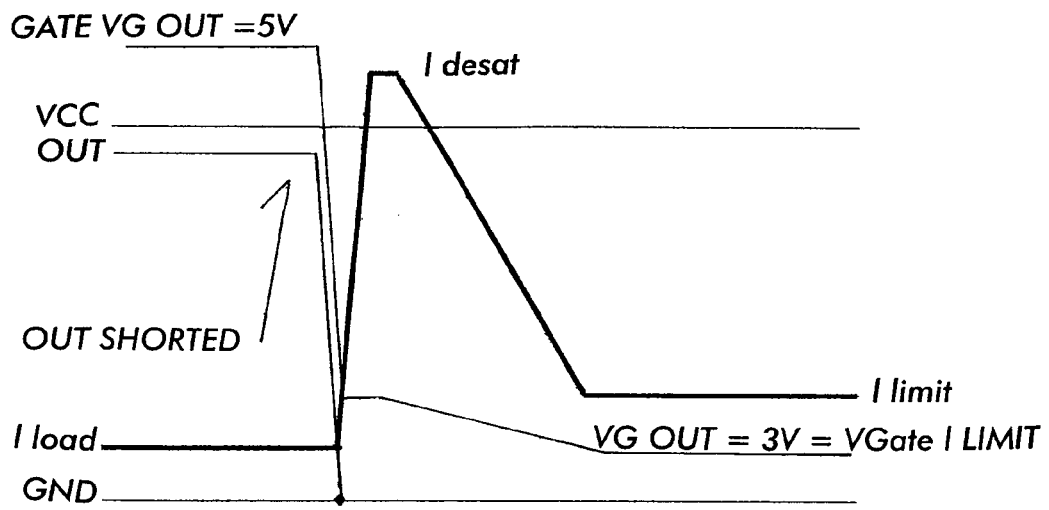
FIG. 1a is a diagram showing voltage and current acting on the power device of the circuit of FIG. 1 during a short circuit.

In the case where the power device 10 turns "ON" on a short circuit condition, the current will increase slowly as the gate-source voltage $V_{gs}$ increases to a level where the current becomes equal to the current limit $I_{LIMIT}$. If the loop is made to have no overshoot, the current does not exceed the current limit $I_{LIMIT}$ and will never reach a shutdown current $I_{shutdown}$. Thus, in this case, the circuit of FIG. 2 will behave as the prior art circuit of FIG. 1.

In the case where the short circuit occurs after the power device 10 is turned ON, as in FIG. 2A, and the current exceeds the limit set by a second reference voltage REF2, the output of the second comparator COMP2 will then set a latch which will turn on a transistor 30 which will set the gate to 0 volts and turn the transistor 20 and the power device 10 OFF. This is illustrated in FIG. 2A by the short circuit created when a load current $I_{load}$ reaches the current limit $I_{REF2}$ or $I_{shutdown}$ set by the second reference voltage REF2 and the power switch shuts down with the current going to 0.

The shutdown may be very fast since no oscillation can be expected since it is not a closed loop system. A 20-microsecond turnoff time is possible. When the power switch is fully off, the IPS can restart as shown in FIG. 2A. The restart process is identical to that where the IPS is starting with a short circuit condition if the short circuit is still present. Accordingly, no overshoot is possible and the current still proceeds and is limited by the current limit $I_{LIMIT}$ set by the reference current $I_{REF1}$.

This allows keeping the slow turn ON and slow turn OFF in normal operation to ensure low electromagnetic interference (EMI) generation. It also ensures no large peak currents in the case of sudden short circuits greater than the die area determined by RDSON and not by minimum area to stand the peak current, for example, using trench technologies. Large peaks of currents also create problems since such large peaks may collapse the battery supply. The invention allows using a very slow, stable loop for current limitation.

Another advantage of the present invention is that depending on the design, current limiting blocks may not operate below a certain drain-source voltage $V_{DS}$ and in any case, if the short circuit protection operates at lower a voltage $V_{DS}$, the current in the circuit of FIG. 2 would be lower than the short circuit current $I_{SC}$. Otherwise, the current in the circuit of FIG. 2 would only be limited by $(V_{ds} \text{ min } I_{LIMIT})$/RDSON. In a realistic example this may be 1V/10 mOhm=100 A, i.e., twice the wanted current limitation level 50 A. The circuit of FIG. 2 would trigger at trigger current of, e.g., 70 A, and the second additional transistor circuit 30 would restart and limit the circuit of FIG. 2 at the wanted current limitation level of 50 A. There is no such limitation in the prior art short circuit limitation circuit of FIG. 1.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. An intelligent power switch (IPS) circuit providing current protection for a power switch, a gate terminal of the power switch being controlled by a first control signal generated by a gate driver, the circuit comprising:
   a first circuit to measure a current in the power switch, determine a first difference between a first voltage and a first reference voltage, and reduce the first control signal if the first difference exceeds a first predetermined limit; and
   a second circuit distinct from the first circuit, the second circuit to measure the current in the power switch and determine a second difference between the first voltage and a second reference voltage, wherein if the second difference exceeds a second predetermined limit the first control signal is set to turn OFF the power switch;
   said power switch configured such that a desirable value of said current is less than or equal to 50 amperes.

2. The circuit of claim 1, wherein the second reference voltage is above the first reference voltage.

3. The circuit of claim 1, wherein the power switch is turned OFF in at least one case selected from overcurrent, overtemperature, and other overloads.

4. The circuit of claim 1, wherein the first circuit further comprises a first current measuring circuit to measure the current in the power switch, the first current measuring circuit being selected from at least one of a first switch parallel connected to the power switch, an external shunt in series with the power switch, a resistor in series with the power switch.

5. The circuit of claim 4, wherein the first current measuring circuit includes the first switch parallel connected to the power switch and the resistor in series with the power switch, wherein, the first switch passes a small fraction of a current flowing through the power switch and the resistor is connected between a source terminal of the first switch and a source terminal of the power switch for sensing the current and determining the amount of current going to a load.

6. The circuit of claim 5, wherein the load is selected from at least one of resistive and reactive components.

7. The circuit of claim 4, wherein the first current measuring circuit is selected from at least one of components integral with and separate from the power switch.

8. The circuit of claim 4, wherein the second circuit further comprises a second current measuring circuit to measure the current in the power switch, the second current measuring circuit being a second switch having a terminal connected to the gate terminal of the power switch and a second terminal connected to a main terminal of the power switch, wherein when the second switch is turned ON the power switch turns OFF.

9. The circuit of claim 8, wherein the first circuit further comprises a first comparator to determine the first difference and the second circuit further comprises a second comparator to determine the second difference.

10. The circuit of claim 9, wherein the second circuit further comprises a setting device connected to the second comparator to receive control signals and to a gate of the second switch, wherein after receiving a SET control signal from the second comparator the latch turns ON the second switch thereby turning OFF the power switch.

11. The circuit of claim 10, wherein the setting device is selected from at least one of a latch having a reset input, a monostable, and a one-shot.

12. The circuit of claim 10, wherein a slow turn ON and turn OFF of the power switch in normal operation ensure low electromagnetic interference (EMI) generation.

13. An intelligent power switch (IPS) circuit to control a gate terminal of a power switch, the IPS circuit comprising:
   a first circuit to monitor a monitored current passing through the power switch, the first circuit configured to control/reduce/terminate a gate current to the power switch if the monitored current is excessive;
   a second circuit distinct from the first circuit, the second circuit to monitor the monitored current, the second circuit configured to implement a predetermined delay in a turn OFF of the power switch;
   wherein the first circuit and the second circuit measure a first voltage across a resistor parallel connected with the power switch to monitor said monitored current.

14. The IPS circuit of claim 13, wherein the second circuit comprises a setting device.

15. The IPS circuit of claim 14, wherein the setting device comprises one of a latch having a reset input, a monostable, and a one-shot.

16. The IPS circuit of claim 13, wherein the second circuit is configured to ensure a low electromagnetic interference (EMI) during a normal operation of the IPS circuit.

17. The IPS circuit of claim 13, wherein the IPS circuit is adapted for use with a motor.

18. The IPS circuit of claim 13, wherein:
  the first circuit comprises a comparator configured to control/reduce/terminate the gate current based on the first voltage.

19. The IPS circuit of claim 13, wherein:
  the second circuit comprises a comparator configured to implement the predetermined delay based on the first voltage.

20. The IPS circuit of claim 13, wherein the first circuit does not comprise a bipolar junction transistor (BJT).

* * * * *